(12) United States Patent
Farnsworth, III et al.

(10) Patent No.: US 7,434,129 B2
(45) Date of Patent: Oct. 7, 2008

(54) PARTIAL GOOD INTEGRATED CIRCUIT AND METHOD OF TESTING SAME

(75) Inventors: Leonard O. Farnsworth, III, Lincoln, VT (US); Michael Z. Felske, Milton, VT (US); Pamela S. Gillia, Jericho, VT (US); Benjamin P. Lynch, Colchester, VT (US); Michael R. Ouellette, Westford, VT (US); Thomas St. Pierre, Forstinning (DE); Tad J. Wilder, South Hero, VT (US); Carl F. Barnhart, Ojai, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/859,834

(22) Filed: Sep. 24, 2007

(65) Prior Publication Data

US 2008/0010571 A1    Jan. 10, 2008

Related U.S. Application Data

(63) Continuation of application No. 10/651,874, filed on Aug. 29, 2003, now Pat. No. 7,305,600.

(51) Int. Cl.
*G01R 31/28* (2006.01)
(52) U.S. Cl. .................................. 714/729; 714/726
(58) Field of Classification Search ............... 714/726, 714/729
See application file for complete search history.

(56) References Cited

U.S. PATENT DOCUMENTS

| | | | |
|---|---|---|---|
| 5,610,867 | A | 3/1997 | DeBrosse et al. |
| 6,363,020 | B1 | 3/2002 | Shubat et al. |
| 6,505,324 | B1 | 1/2003 | Cowan et al. |
| 6,757,204 | B2 | 6/2004 | Di Ronza et al. |
| 6,829,181 | B1 | 12/2004 | Seitoh |

*Primary Examiner*—Cynthia Britt
*Assistant Examiner*—John J Tabone, Jr.
(74) *Attorney, Agent, or Firm*—Schmeiser, Olson & Watts; Anthony J. Canale

(57) ABSTRACT

An integrated circuit and method of testing and repairing the integrated circuit. The integrated circuit includes: a multiplicity of macro-circuits having the same function; a fuse bank, the state of the fuses storing test data indicating at least which macro-circuits failed a test; and means for preventing utilization of failing macro-circuits during operation of the integrated circuit and a method generating a partial good integrated circuit, the method including: providing an integrated circuit have a multiplicity of macro-circuits arranged in one or more groups, each macro-circuit having the same function and a fuse bank containing fuses; testing each macro-circuit prior to a fuse programming operation; programming the fuses in the fuse bank in order to store data indicating at least which macro-circuits failed the testing step; and preventing utilization of each failing macro-circuit during operation of the integrated based on the data stored in the fuse bank.

11 Claims, 9 Drawing Sheets

PARTIAL GOOD INTEGRATED CIRCUIT AND METHOD OF TESTING SAME

This Application is a continuation of U.S. patent application Ser. No. 10/651,874 filed on Aug. 29, 2003.

FIELD OF THE INVENTION

The present invention relates to the field of integrated circuits; more specifically, it relates to an integrated circuit designed with partial good functionality and the method of testing the integrated circuit.

BACKGROUND OF THE INVENTION

When a fault in an integrated circuit chip caused by a manufacturing defect is detected during testing, the entire integrated circuit chip is rendered non-functional unless a method of repair has been provided. Integrated circuit chips having such repair capability may use redundancy, (substitution of redundant circuits for failing circuits) partial good techniques, (ignoring or disabling some circuitry, and accepting reduced function or performance) or a combination of both. When partial good techniques are being used and partial good chips are detected during test, these chips need to be sorted into multiple part numbers based upon the exact circuit or circuit location that has failed. This indicates to the user what the function or performance of each chip will be. With more than a few circuits that could fail and still allow a partial good chip, this method becomes costly and difficult for production control organizations to administer. Therefore, there is a need for methods and integrated circuits that are repairable in a more cost-effective manner.

SUMMARY OF THE INVENTION

A first aspect of the present invention is an integrated circuit, comprising: a multiplicity of macro-circuits, each macro-circuit of the multiplicity of identical macro-circuits being a logic circuit having the same function; one or more repairable circuits; a fuse bank containing a multiplicity of fuses partitioned into a first set of fuses and a second set of fuses, states of fuses of the first set of fuses storing test data indicating at least which macro-circuits of the multiplicity of macro-circuits failed a first test, states of fuses of the second set of fuses storing test data indicating which repairable circuits of the one or more repairable circuits failed a second test; a scan multiplexer and control circuit connected to scan-in I/O pads and scan-out I/O pads and connected to each of the identical macro-circuits, the scan multiplexer and control circuit including means for selectively connecting the scan-in I/O pads and scan-out I/O pads to and disconnecting the scan-in I/O pads and scan-out I/O pads from each of the macro-circuits of the multiplicity of identical macro-circuits during testing of the multiplicity of identical macro-circuits; means for isolating each macro-circuit of the multiplicity of macro-circuits from any other logic circuits of the integrated circuit chip and means for connecting scan-in and scan-out pins dedicated to each macro-circuit of the multiplicity of macro-circuits to respective pads of the scan-in I/O pads and scan-out I/O pads; means for permanently preventing utilization of those macro-circuits during operation of the integrated circuit that did not pass the test during operation of the integrated circuit, the means for permanently preventing responsive to the state of fuses in the fuse bank; and means to replace failing circuit portions of the repairable circuits with redundant good circuit portions based on a state of fuses of the second set of fuses.

A second aspect of the present invention is method of generating a partial good integrated circuit, the method comprising: providing an integrated circuit having: a multiplicity of macro-circuits arranged in one or more groups, each macro-circuit of the same group being identical and having the same function; one or more repairable circuits; a fuse bank containing a multiplicity of fuses partitioned into a first set of fuses and a second set of fuses, states of fuses of the first set of fuses storing test data indicating at least which macro-circuits of the multiplicity of macro-circuits failed a first test, states of fuses of the second set of fuses storing test data indicating which repairable circuits of the one or more repairable circuits failed a second test a scan multiplexer and control circuit connected to scan-in I/O pads and scan-out I/O pads and connected to each of the identical macro-circuits, the scan multiplexer and control circuit including means for selectively connecting the scan-in I/O pads and scan-out I/O pads to and disconnecting the scan-in I/O pads and scan-out I/O pads from each of the macro-circuits of the multiplicity of identical macro-circuits during testing of the multiplicity of identical macro-circuits; means for isolating each macro-circuit of the multiplicity of macro-circuits from any other logic circuits of the integrated circuit chip and for means for connecting scan-in and scan-out pins dedicated to each macro-circuit of the multiplicity of macro-circuits to respective pads of the scan-in I/O pads and scan-out I/O pads; and means to replace failing circuit portions of the repairable circuits with redundant good circuit portions based on a state of fuses of the second set of fuses; isolating the macro-circuits from other circuits of the integrated circuit by connecting scan-in and scan-out pins dedicated to each macro-circuit of the multiplicity of macro-circuits to respective pads of the scan-in I/O pads and scan-out I/O pads; performing a first testing operation of each macro-circuit of the multiplicity of macro-circuits prior to a fuse programming operation; performing a second testing operation on each repairable circuit of the one or more repairable circuits prior to the fuse programming operation; programming fuses in the first set of fuses in order to store data indicating which macro-circuits failed the first testing operation; programming fuses in the second set of fuses in order to store data indicating which repairable circuits failed the second testing operation; for each macro-circuit of the multiplicity of macro-circuits that failed the first testing operation, permanently preventing utilization of the entire failing macro-circuit during operation of the integrated circuit based on data stored in the first set of fuses and configuring the integrated circuit to utilize only macro-circuits that passed the testing; and for each repairable circuit of the one or more repairable circuits replacing failing circuit portions of the repairable circuits with redundant good circuit portions based on data stored in the second set of fuses.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

For the purposes of the present invention, a macro-circuit is defined as a group of one or more circuits that perform a predetermined function. The circuits may be as simple as a single passive (i.e. resistor, capacitor inductor) or active (i.e. diode, transistor) device, a single gate (e.g., AND, NAND OR, NOR, INVERT) or as complicated as a microprocessor. Often macro-circuits are pre-designed as cores in a design library. Examples of macro-circuits include, microprocessors, embedded memory circuits and custom function circuits to name a few.

Figure 1:
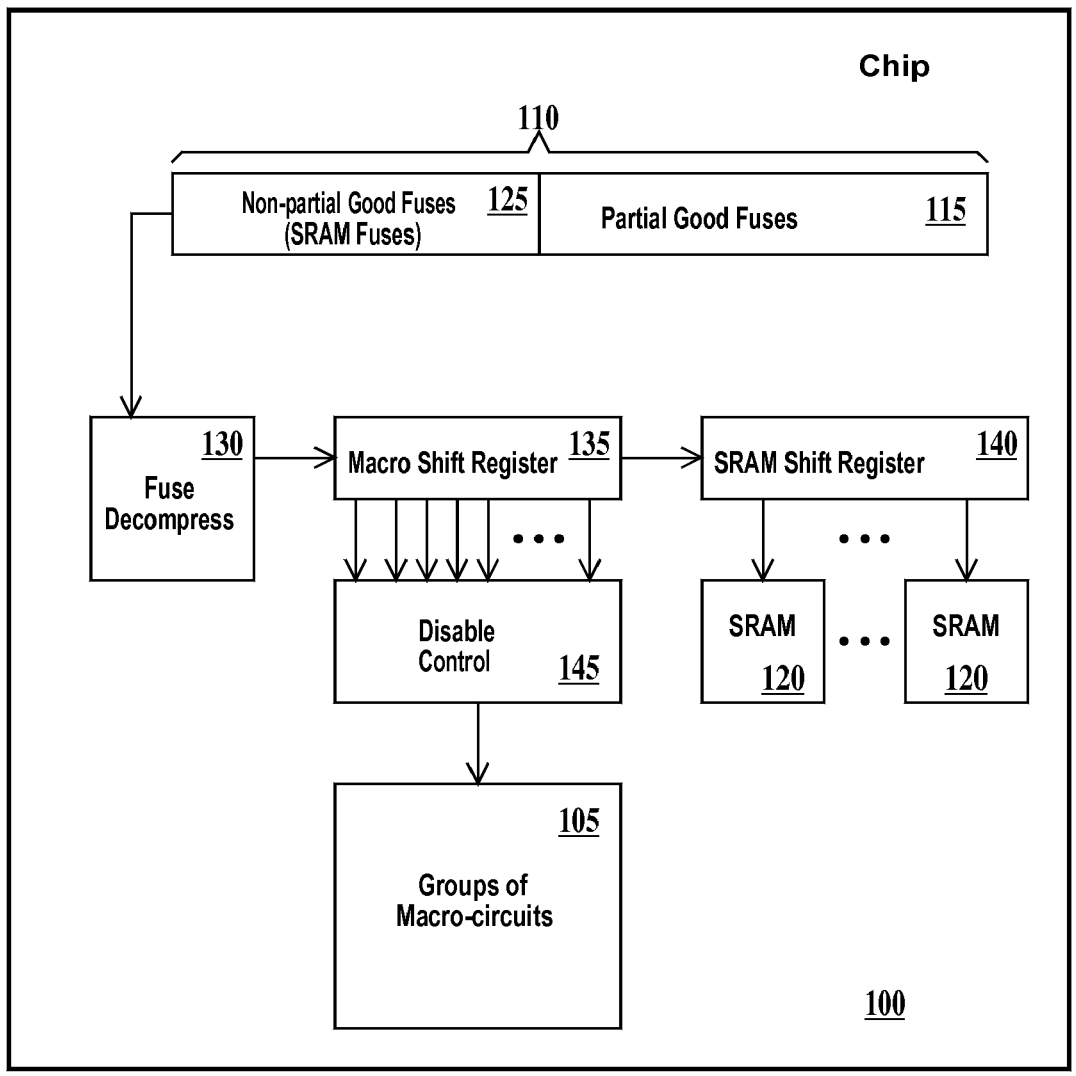
FIG. 1 is a schematic diagram of an integrated circuit chip according to the present invention.

FIG. 1 is a schematic diagram of an integrated circuit chip 100 according to the present invention. In FIG. 1, integrated circuit chip 100 includes groups of macro-circuits 105, a fuse bank 110 including a partial good section 115 containing fuses storing data related to macro-circuits within groups of macro-circuits 105 and a non-partial good fuse section 125 containing fuses storing data related to optional static random access memory (SRAM) circuits 120. Groups of macro-circuits 105 may contain one or more groups of macro-circuits. Each group of macro-circuits may contain one or more identical macro-circuits. Fuse bank 110 may include one fuse storing pass or fail information for each macro-circuit in groups of macro-circuits 105 or a lesser amount of fuses for storing data only for failing macro-circuits in groups of macro-circuits 105. Fuse bank 110 may include laser blow fuses, electrical blow fuses or electrical blow antifuses. The term blowing a fuse is defined as being the same as programming a fuse. Integrated circuit chip 100 further includes a fuse decompress circuit 130 decompressing (if the fuse bank contains information in compressed form) the data represented by the fuses and for moving the fuse data into a macro shift register 135 and an optional SRAM shift register 140 for readout. Data in macro-circuit shift register 135 is read by a disable control circuit 145 which may disable failing macro-circuits within groups of macro-circuits 105 directly, or disable control circuit 145 may be used by a system which integrated circuit chip 100 is connected to, the system disabling failing macro-circuits within the group of macro-circuits. Disabling may be by disconnection of failing macro-circuits or, in the example of the macro-circuits being microprocessors, by setting their "busy" bit or "disabled" bit permanently on, so no operations are directed to failing macro-circuits, or by other methods known in the art. Repair circuits within each SRAM 120 read fuse data from SRAM shift register 140 (which contains the data stored in non-partial good fuse portion 125 of fuse bank 110) and affect repair of failing portions of each SRAM circuit 120 by replacement of failing circuits with redundant (spare) tested good circuits.

Optional non-partial good fuse portion 125 of fuse bank 110, SRAM shift register 140 and SRAMs 120 are illustrated to show how the present invention may be integrated into well-known repair schemes. The SRAM circuits may not be present or may be replaced or augmented by any other repairable circuit (such as embedded dynamic random access memory) or even fuse adjustable circuits (such as voltage regulators and frequency dividers). More than one group of macro-circuits may be present on the same integrated circuit chip, connected to the same fuse bank by multiple serial shift registers or each macro-circuit group having its own fuse bank and supporting circuitry. Additional logic circuits, testable by means well known in the art, may be present but are not illustrated in FIG. 1. These additional logic circuits (as well as the optional SRAM circuits 120 or their substitutes as described supra) are for the purposes of the present invention designated as non partial good (NPG) circuits and the macro-circuits within groups of macro-circuits 105 are designated partial good (PG) circuits because integrated circuit chip 100 still can function with one or more failing macro-circuits within groups of macro-circuits 105.

Figure 2:
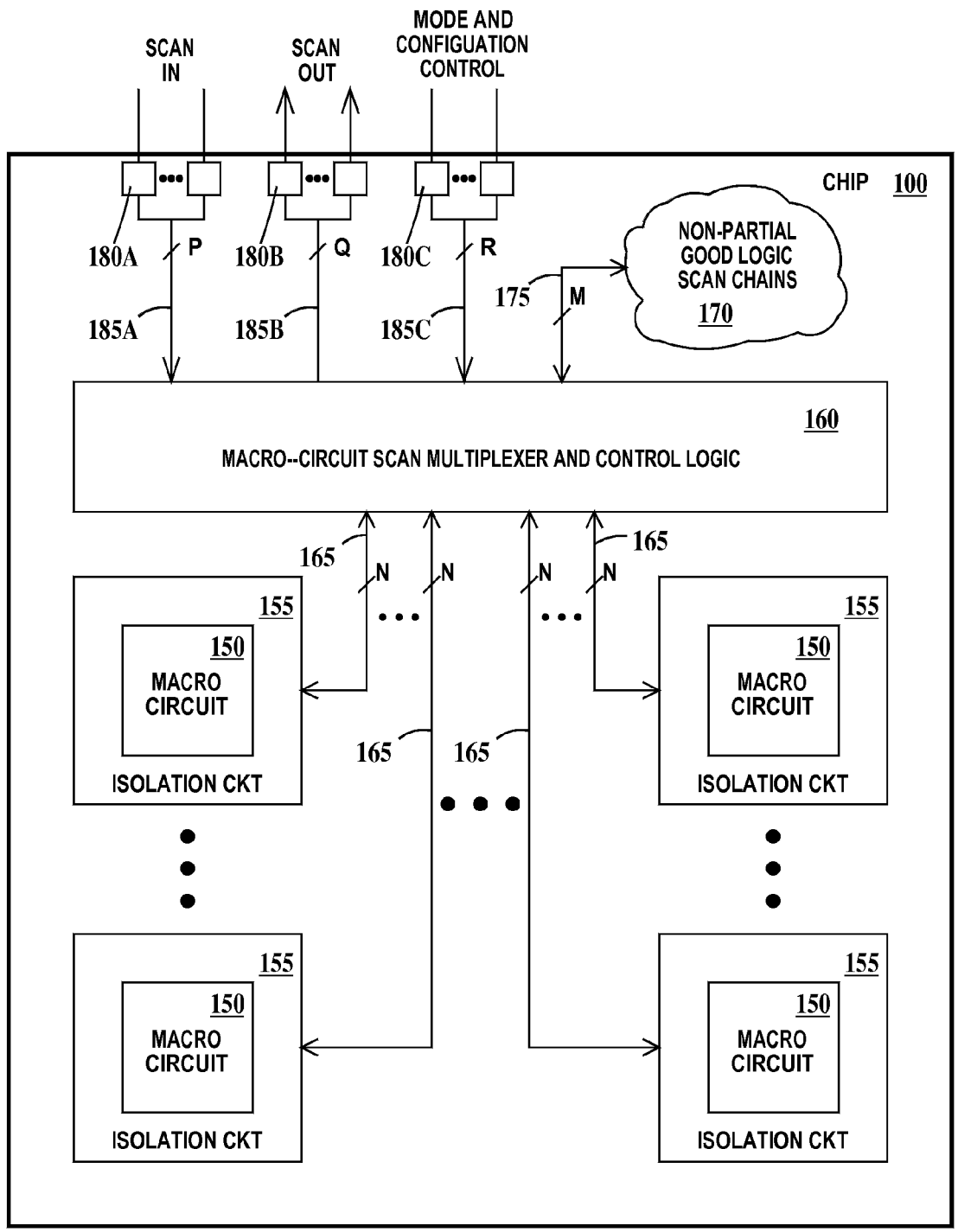
FIG. 2 is a schematic diagram illustrating the chip architecture for testing the integrated circuit chip of FIG. 1.

FIG. 2 is a schematic diagram illustrating the chip architecture for testing integrated circuit chip 100. In FIG. 2, integrated circuit chip 100 includes a multiplicity of macro-circuits 150 and a multiplicity of isolation circuits 155. There is one isolation circuit 155 for each macro-circuit 150. Each macro circuit 150/isolation circuit 155 is coupled to a macro-circuit scan multiplexer and control logic 160 by a corresponding bus 165. Each bus 165 includes wires for at least macro-circuit scan-out signals and isolation circuit scan-in, scan-out and control signals. Macro-circuit scan multiplexer and control logic 160 is further coupled to all the NPG circuit scan chains 170 by a bus 175. Bus 175 includes wires for at least multiple NPG scan-in signals and multiple NPG scan-out signals. Macro-circuit scan multiplexer and control logic 160 is also coupled to multiple I/O pads 180A by bus 185A for receiving scan-in signals from off chip, multiple I/O pads 180B by bus 185B for sending scan-out signals off chip and multiple I/O pads 180C by bus 185C for receiving mode and configuration control signals from a tester. Mode and configuration control signals are used by macro-circuit scan multiplexer and control logic 160 to configure scan chains for testing either macro-circuits 150 or the NPG circuits of integrated circuit chip 100 as illustrated in FIGS. 3A, 3B, 3C and 4 and described infra. While not necessarily separate signals, mode control can be thought of as selecting whether to test macro-circuits or NPG circuits and configuration signals can be thought of as selecting groups of macro-circuits to test together. While isolation circuits 155 are illustrated "outside" of macro-circuits 150, the isolation circuits may be incorporated within each macro-circuit.

In operation, macro-circuit scan multiplexer and control logic 160, in conjunction with isolation circuitry 155, acts to prevent faults in individual macro-circuits 150 from propagating into NPG circuit scan chains 170 during NPG circuit testing and to prevent faults in NPG circuits or other macro-circuits 150 from propagating to the macro-circuit scan chain of the macro-circuit currently being tested. While scan chain isolation techniques are used in describing the present invention it should be understood that many techniques may be used for effecting isolation of macro-circuits 150 and NPG circuits during testing, including, but not limited to: boundary scan, macro-circuit by-pass multiplexing, clock disablement and any other techniques well known in the art.

Figure 3A:
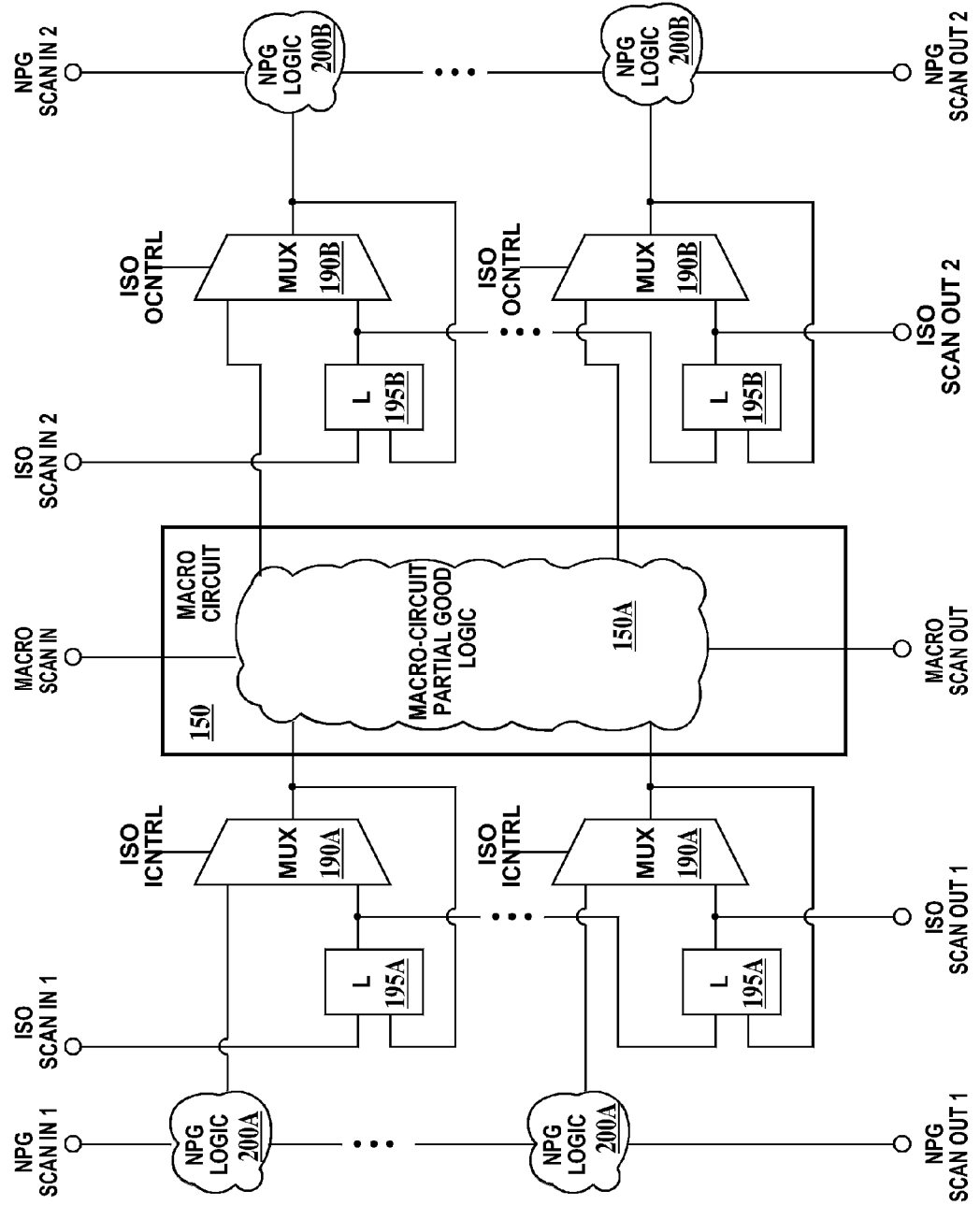
FIG. 3A is a detailed schematic diagram illustrating the interconnections between macro-circuits, isolation circuits and other logic circuits of the integrated circuit chip of FIG. 2.

FIG. 3A is a detailed schematic diagram illustrating an example of the interconnections between macro-circuits 150, isolation circuits 155 and other logic circuits of the integrated circuit chip of FIG. 2. In FIG. 3A, isolation circuits 155 (see FIG. 2) include a multiplicity of input isolation multiplexers 190A and input latches 195A and a multiplicity of output isolation multiplexers 190B and output latches 195B.

A first input of each input latch 195A is coupled to an isolation scan-in node of a first isolation scan chain (ISO SCAN-IN 1) (in the case of the first input latch 195A) or the output of a previous input latch 195A (in the case all other input latches 195A in the first isolation scan chain). A second input of each input latch 195A is coupled to the output of its corresponding input isolation multiplexer 190A. The output of each input latch 195A is coupled to a first input of its corresponding input isolation multiplexer 190A. The output of the last input latch 195A is also coupled to an isolation scan-out node of the first isolation scan chain (ISO SCAN-OUT 1). The output of each input isolation multiplexer 190A is coupled to internal logic 150A of macro circuit 150. A second input of each input isolation multiplexer 190A is coupled to an input NPG logic circuit 200A. Input NPG logic circuits 200A are the circuits that supply input signals to macro-circuit 150 during functional operation. Input NPG logic circuits 200A are coupled sequentially between an NPG scan-in node of a first NPG scan chain (NPG SCAN-IN 1) and an NPG scan-out node of the first NPG scan chain (NPG SCAN-OUT 1).

A first input of each output latch 195B is coupled to an isolation scan-in node of a second isolation scan chain (ISO SCAN-IN 2) (in the case of the first output latch 195B) or the output of a previous output latch 195B (in the case all other output latches 195B in the second isolation scan chain). A second input of each output latch 195B is coupled to the output of its corresponding output isolation multiplexer 190B. The output of each output latch 195B is coupled to a first input of its corresponding output isolation multiplexer 190B. The output of the last input latch 195B is also coupled to an isolation scan-out node of the second isolation scan chain (ISO SCAN-OUT 2). A second input of each output isolation multiplexer 190B is coupled to internal logic 150A of macro circuit 150. The output of each output isolation multiplexer 190B is coupled to an output NPG logic circuit 200B. Output NPG logic circuits 200B are the circuits that receive output signals from macro-circuit 150 during functional operation. Output NPG logic circuits 200B are coupled sequentially between an NPG scan-in node of a second NPG scan chain (NPG SCAN-IN 2) and an NPG scan-out node of the second NPG scan chain (NPG SCAN-OUT 2).

Macro-circuit internal logic 150A is coupled between a MACRO SCAN-IN node and a MACRO SCAN-OUT node. All input isolation multiplexers 190A are responsive to an isolation input control signal (ISO ICNTRL) carried by bus 165 of FIG. 2. All output isolation multiplexers 190B are responsive to an isolation output control signal (ISO OCNTRL) carried by bus 165 of FIG. 2. Macro-circuit scan multiplexer and control logic 160 (see FIG. 2) is used to affect connections between the various scan-in and scan-out nodes for NPG testing and macro-circuit testing as illustrated in FIGS. 3B and 3C and described infra.

Figure 3B:
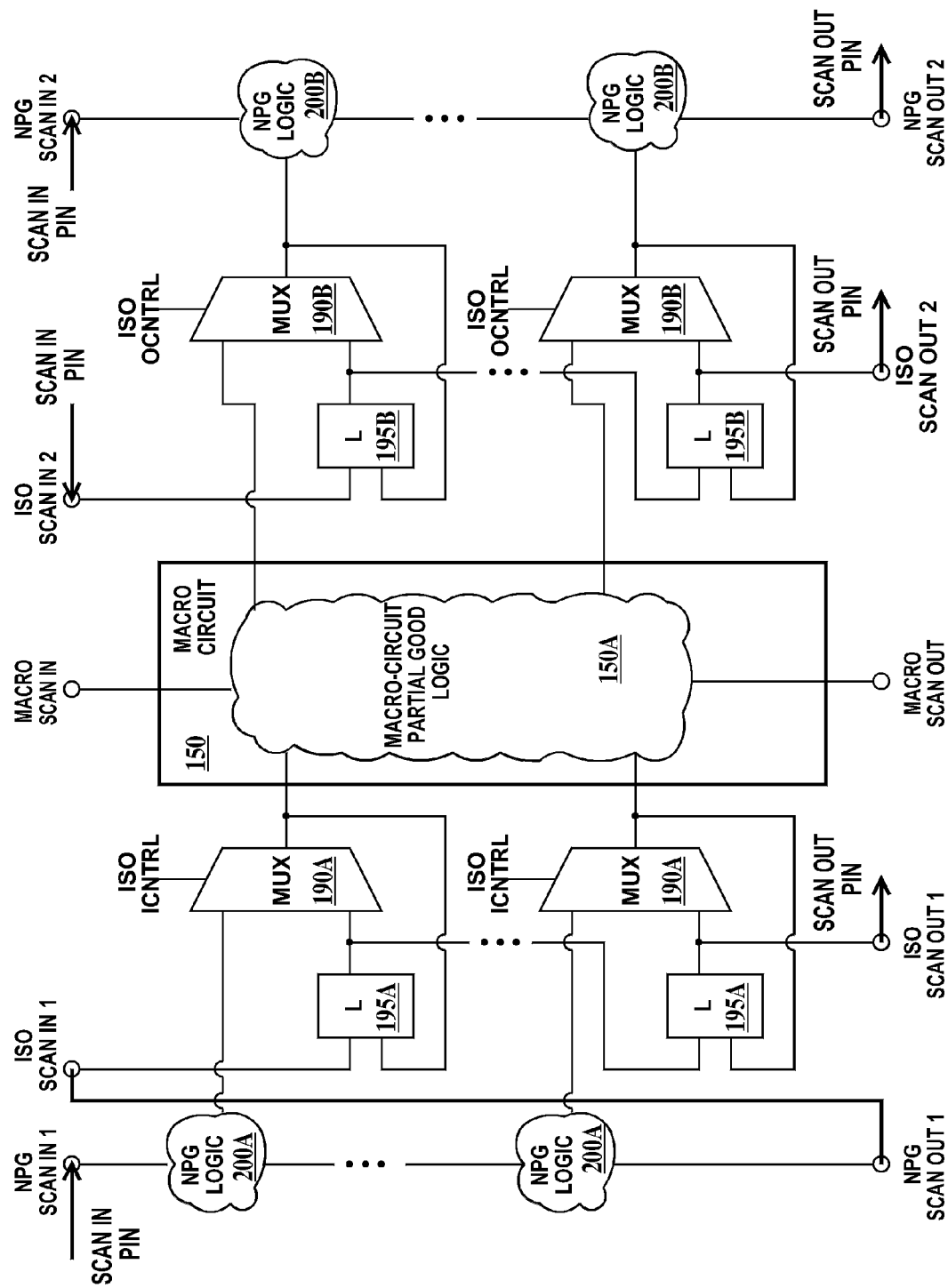
FIG. 3B is a schematic diagram illustrating an example of scan node connections for the circuit of FIG. 3A for non-partial good logic testing.

FIG. 3B is a schematic diagram illustrating an example of scan node connections for the circuit of FIG. 3A for NPG logic testing. In FIG. 3B, macro-circuit scan multiplexer and control logic 160 (see FIG. 2) makes the following connections for NPG circuit logic 200A and 200B testing: node NPG SCAN-IN 1 is coupled to a first scan-in pin, node NPG SCAN-OUT 1 is coupled to node ISO SCAN-IN 1, node ISO SCAN-OUT 1 is coupled to a first scan-out pin, node ISO SCAN-IN 2 is coupled to a second scan-in pin, node ISO SCAN-OUT 2 is coupled to a second scan-out pin, node NPG SCAN-IN 2 is coupled to a third scan-in pin and node NPG SCAN-OUT 2 is coupled to a third scan-out pin. This set of connections, coupled with setting ISO OCNTRL equal to A1@ prevents faults in macro circuits 150 from propagating into NPG logic 200A and 200B during NPG testing, while allowing complete observation of NPG logic. While three scan-in pins and three scan-out pins are illustrated in FIG. 3B, any number of scan-in and scan-out pins may be used by adjustment to the interconnection scheme.

Figure 3C:
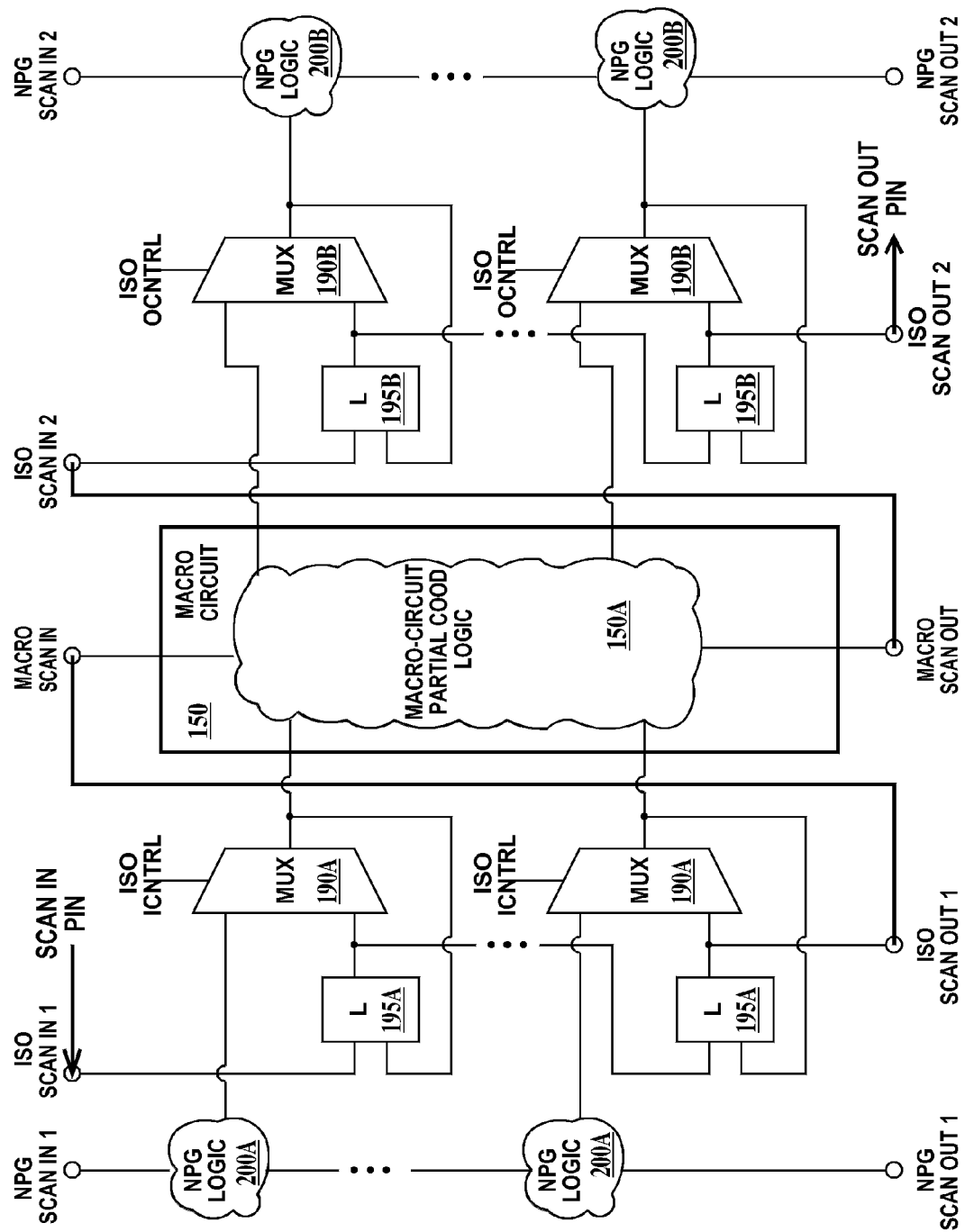
FIG. 3C is a schematic diagram illustrating an example of scan node connections for the circuit of FIG. 3A for macro-circuit partial good logic testing.

FIG. 3C is a schematic diagram illustrating an example of scan node connections for the circuit of FIG. 3A for macro-circuit 150 partial good logic testing. In FIG. 3C, macro-circuit scan multiplexer and control logic 160 (see FIG. 2) makes the following connections for macro-circuit 150 testing: node ISO SCAN-IN 1 is coupled a scan-in pin, node ISO SCAN-OUT 1 is coupled to node MACRO SCAN-IN, node MACRO SCAN-OUT is coupled to node ISO SCAN-IN 2 and node ISO SCAN-OUT 2 is coupled to a scan-out pin. This set of connections, coupled with setting ISO ICNTRL equal to "1:" and ISO OCNTRL equal to "0" prevents faults in NPG logic 200A and 200B from propagating into macro-circuit 150 testing during macro-circuit testing, while allowing complete observation of macro circuit 150. While a single macro-circuit 150 is illustrated in FIG. 3C, multiple identical macro-circuits 150, are used according to the number of macros in a group from groups of macro circuits 105, (See FIG. 1) and could share a single scan-in pin. Each macro in a group always has its own scan-out pin. This is illustrated in FIG. 4 and described infra.

Figure 4:
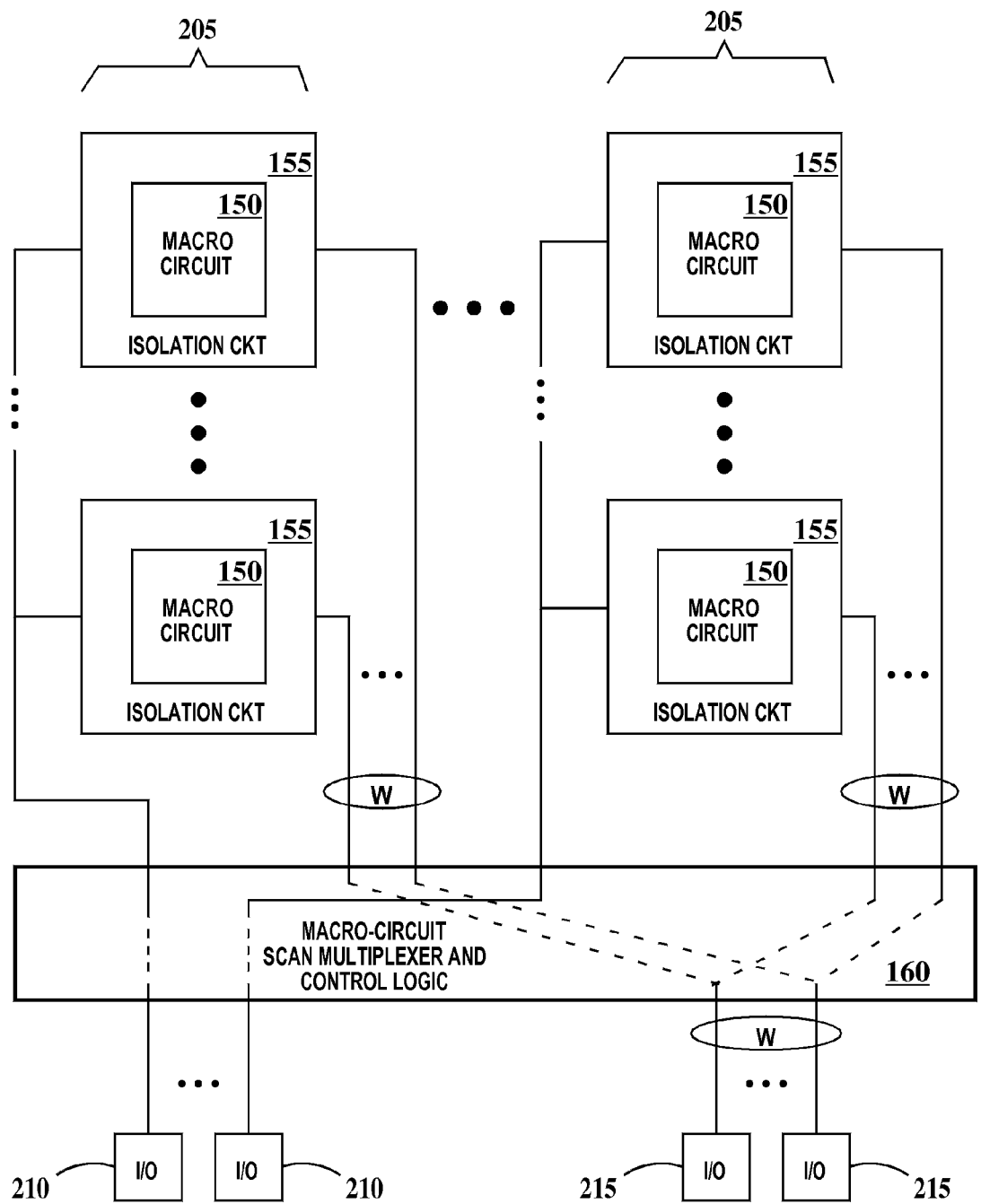
FIG. 4 is a schematic diagram illustrating grouping of macro-circuits for macro circuit testing according to the present invention.

FIG. 4 is a schematic diagram illustrating groupings from the set of groups of macro-circuits 150 for macro circuit testing according to the present invention. In FIG. 4, a multiplicity of macro-circuits 150 are grouped into groups of identical macro-circuits 205. Each isolation circuits 155 of each macro-circuit 150 in each group of macro-circuits is coupled to the same scan-in I/O pad 210 through macro-circuit scan multiplexer and control logic 160. Each isolation circuits 155 of each macro-circuit 150 in each group of macro-circuits is coupled to a different scan-out I/O pad 215 through macro-circuit scan multiplexer and control logic 160. The maximum number of scan-out I/O pads 215 (W) determines the maximum number of macro-circuits 150 in each group of macro-circuits 205, which can be tested at one time. There may be less than W macro-circuits with a group of macro-circuits 155. All macro-circuits 150 within a single group of macro-circuits 155 must be identical (or at least testable by the same test pattern) since all the Macro-circuits in the group will receive the same test patterns via the single scan-in pad.

Figure 5:
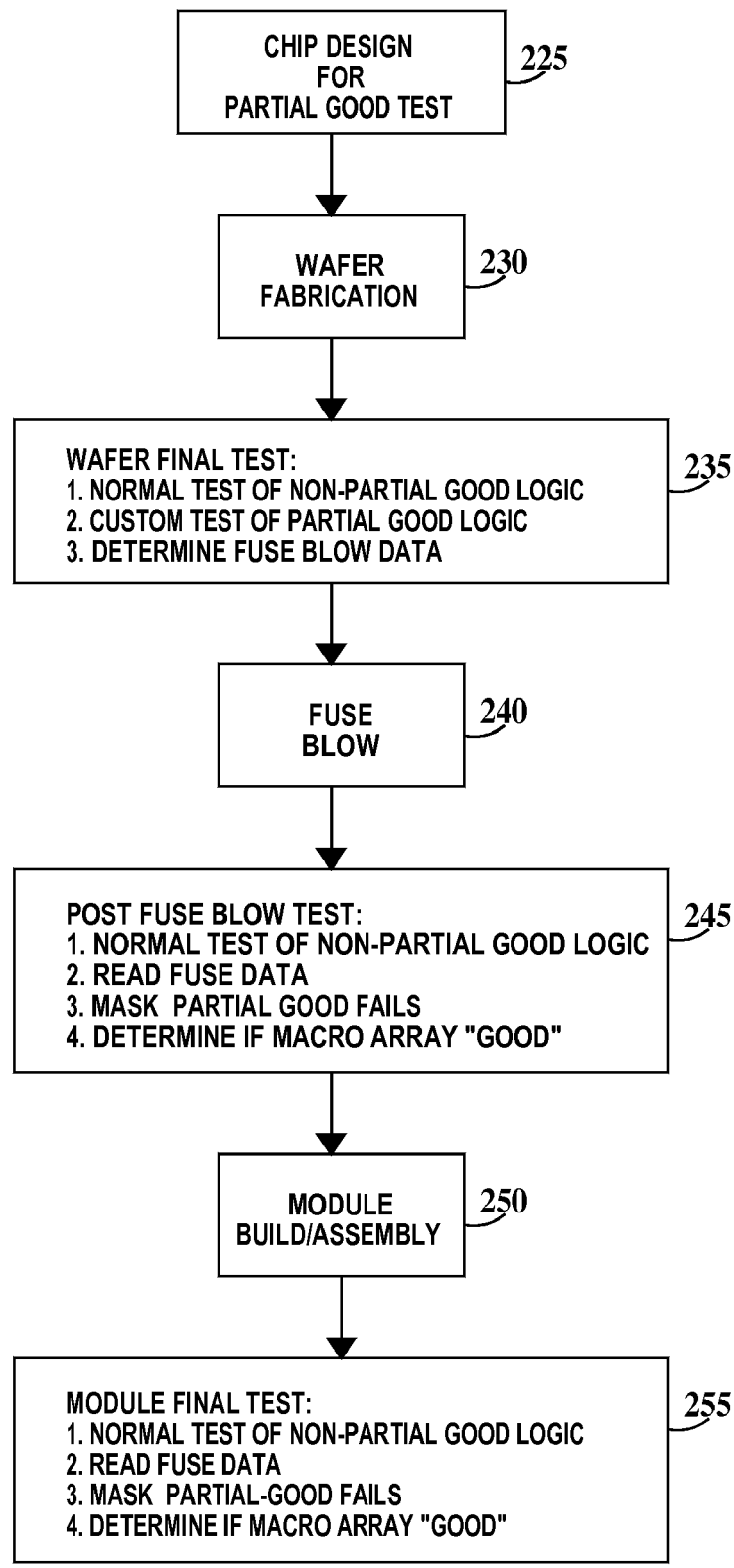
FIG. 5 is an overall flowchart of a method of designing, fabricating and testing the integrated circuit chip of FIG. 1 according to the present invention.

FIG. 5 is an overall flowchart of a method of designing, fabricating and testing integrated circuit chip 100 of FIG. 1 according to the present invention. In step 225, sections of an integrated circuit design that are compatible with the concept of partial good as described supra, (e. g. that could be disabled without causing a fatal failure of the entire integrated circuit) are identified and labeled as candidates for a partial good logic scheme. Isolation logic, standard test logic including scan chains, and supporting circuits such as registers, additional fuse banks etc are added to the design. Alternatively, the macro-circuits could be pre-designed to be compatible with the partial good concept of the present invention or the integrated chip could be designed from the early design stages to be partial good compatible.

In step 230, normal wafer fabrication is performed.

Figure 6:
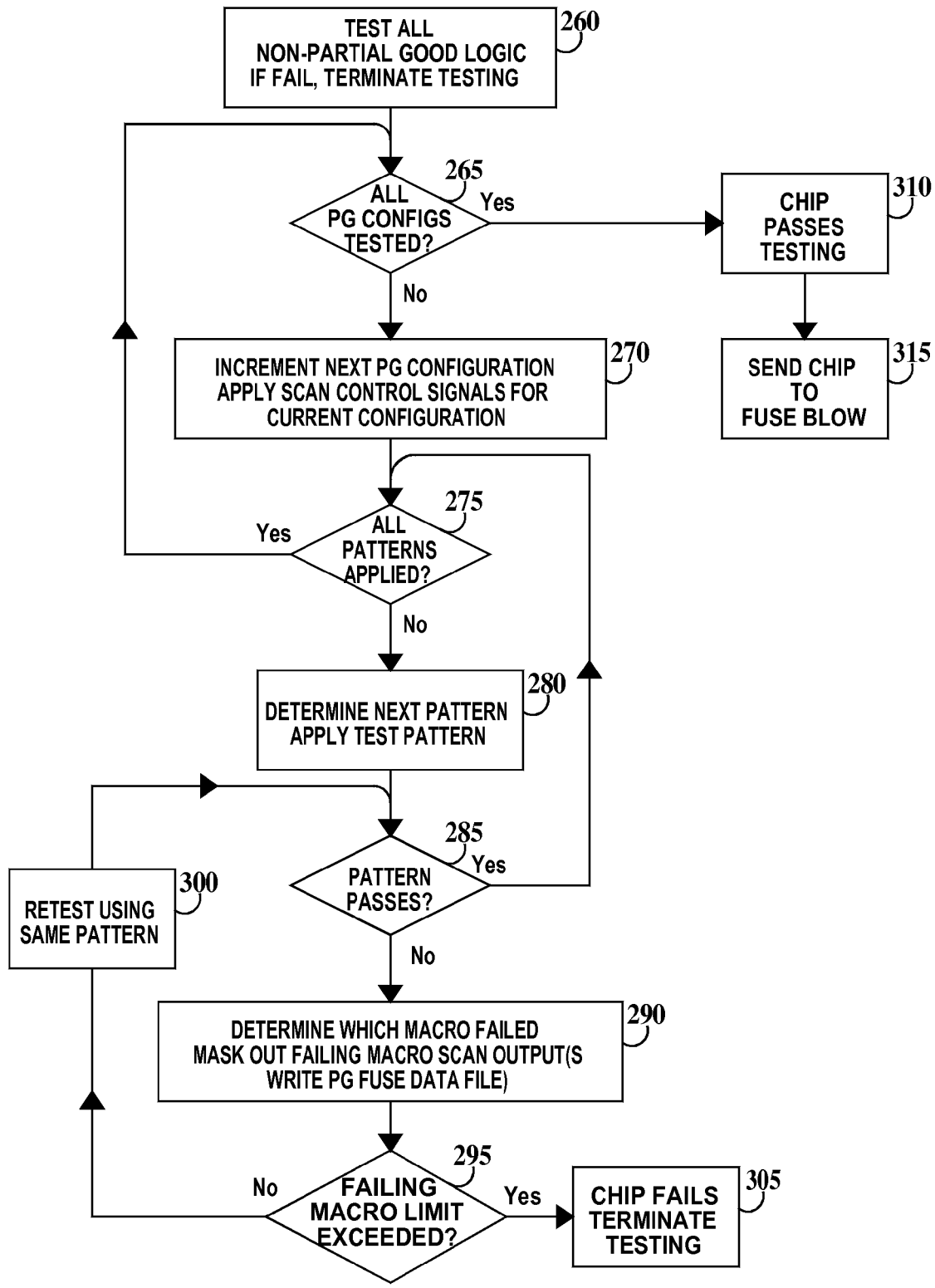
FIG. 6 is a detailed flowchart of a method of wafer level testing of the integrated circuit chip of FIG. 1 according to the present invention.

In step 235, wafer final test is performed. In wafer final test, first, a normal test of non-partial good logic (and any embedded memory) is performed; second, a custom test of partial good logic is performed; and third a determination of a fuse blow pattern is made and stored in a fuse blow file. This fuse blow pattern is a digital representation of the failing macro-circuits of the partial good logic. Custom test of partial good logic is illustrated in FIG. 6 and described in more detail infra.

In step 240, the fuses are blown to encode the identity of failing macro-circuits on the integrated circuit chip itself. A fuse blow tool reads the fuse blow file created during partial good testing by the tester. Fuse blow may be either by laser or electric means.

In step 245, a post fuse blow test is performed. The four main steps are one, a normal testing of non-partial good logic (and any embedded memory); two, reading of the fuses blown in the partial good section of the integrated circuit=s fuse bank; three, masking of scan chain outputs to eliminate known partial good fails; and four, determining if the macro-circuits group is good (e.g. enough non-failing macro-circuits to meet a predetermined performance or functional level.) Masking is defined as an instruction to a tester program to ignore any resultant test data related to a particular macro-circuit. In one example, masking is an instruction to a tester to ignore data on a particular scan-out pin (I/O pad).

In step 250, the integrated chip is built or assembled into a module and in step 255, a module test is performed. Module test is substantially the same as post fuse blow test described in step 245.

FIG. 6 is a detailed flowchart of the method of wafer level testing of the integrated circuit chip of FIG. 1 according to the present invention. In step 260, all non-partial good logic is tested. If any of this logic fails any test, testing is terminated, and the integrated circuit chip is marked as a fail on a pre-fuse blow map by the tester. In step 265, it is determined if all partial-good configurations have been tested. A partial good configuration is a group of identical macro-circuits to be tested. Returning to FIG. 2, a configuration is a set of macro-circuits 150.

If in step 265, it is determined that all the partial good configurations have not been tested, the method proceeds to step 270. In step 270, the tester program is incremented to the next partial good configuration and scan chain multiplexer control signals for the current configuration applied.

Next in step 275, it is determined if all partial good test patterns for the current configuration have been applied. If in step 275, it is determined that all test patterns for the current configuration have been applied, the method loops to step 265, otherwise the method proceeds to step 280.

In step 280, the tester selects the next test pattern for the current partial good configuration and applies that test pattern to the current partial good configurations.

Next in step 285, it is determined if the current configuration passes the current test pattern. If in step 285, it is determined that the current configuration passes the current test pattern, the method loops to step 275, otherwise the method proceeds to step 290.

In step 290, the tester determines which macro-circuit is failing, masks out the scan chain outputs for the failing macro-circuit for subsequent tests and writes the identity of the failing macro-circuit to the partial good fuse file.

In step 295, it is determined if the number of failing macro-circuits of the current partial good configuration exceeds a predetermined limit. If in step 295, it is determined that the limit has not been exceeded, the method proceeds to step 300 where a retest with the same pattern is performed and then to step 285; otherwise the method proceeds to step 305, testing is terminated and the integrated circuit chip is marked as a fail on the pre-fuse blow map by the tester.

Returning to step 265, if in step 265 it is determined that all the partial good configurations have been tested, then in step 310, the integrated circuit chip is marked as good (or partial good) and in step 315 the integrated circuit chip is sent to fuse blow. Electrical fuse blow may be performed by the tester; laser fuse blow requires a laser fuse blow tool that will read the partial good fuse data file created in step 290.

Figure 7:
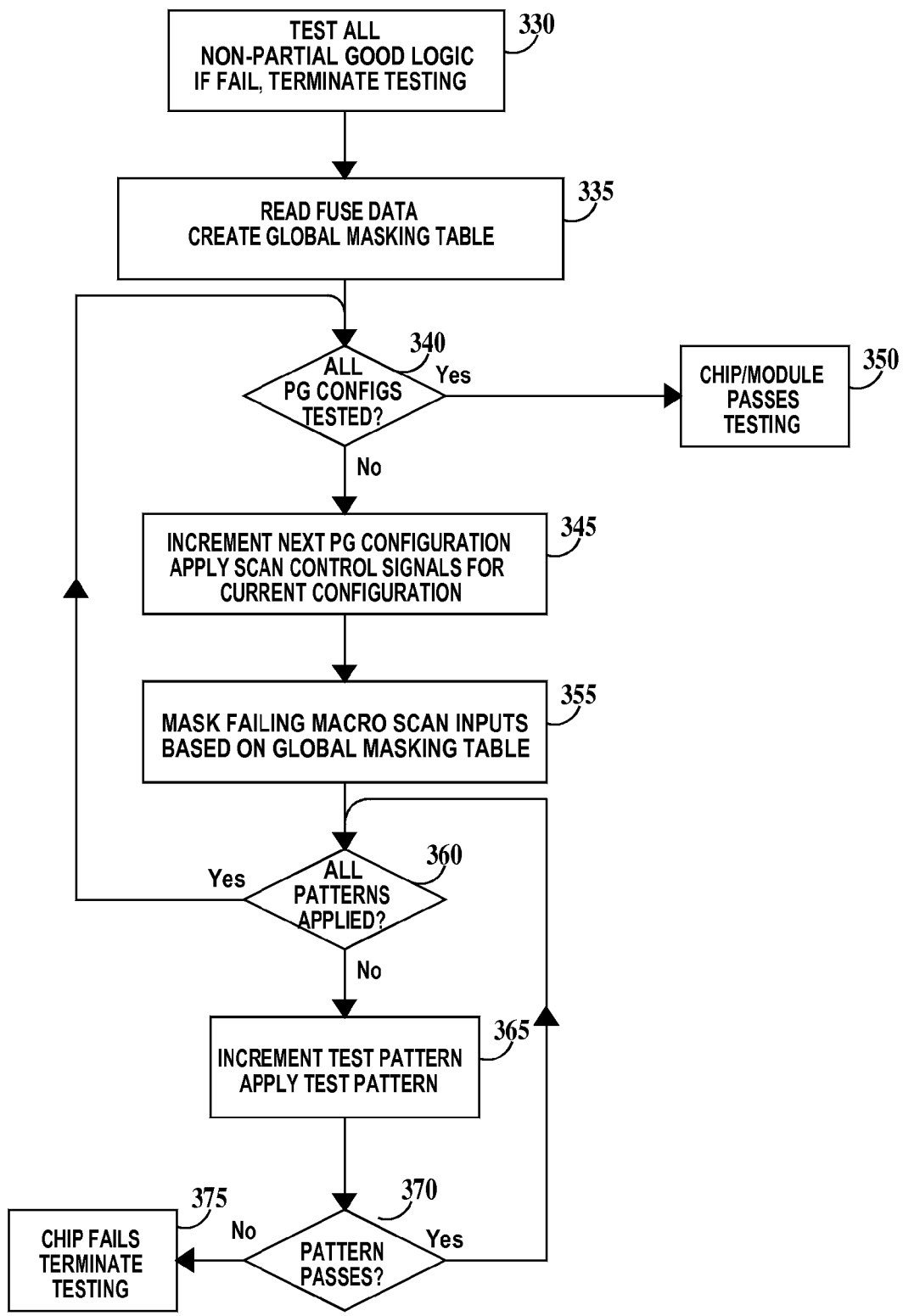
FIG. 7 is a detailed flowchart of a method of post fuse blow wafer level and module level testing of the integrated circuit chip of FIG. 1 according to the present invention.

FIG. 7 is a detailed flowchart of the method of post fuse blow wafer level and module level testing of the integrated circuit chip of FIG. 1 according to the present invention. In step 330, all non-partial good logic is tested. If any of non-partial good logic fails test, testing is terminated and the integrated circuit chip is marked as a fail on a post-fuse blow map or a module is marked as not good.

In step 335, the partial good macro-circuit fuse data is read from the integrated circuit chip itself and a global masking table is generated identifying all partial good failing macro-circuits.

Next in step 340, it is determined if all partial-good configurations have been tested. If in step 340, it is determined that all the partial good configurations have not been tested, the method proceeds to step 345, otherwise the method proceeds to step 350 where the integrated circuit chip is marked as passing post fuse blow test or module test.

In step 345, the tester program is incremented to the next partial good configuration and the scan chain multiplexer control signals for the current configuration applied. Next in step 355, the global mask table is checked for failing macro-circuits belonging to the present configuration and the scan chain outputs of defective partial good macro-circuits in the current configuration are masked.

In step 360, it is determined if all patterns for the current configuration have been applied. If all patterns have been applied, the method loops to step 340 otherwise the method proceeds to step 365. In step 365, the test pattern is incremented and the test pattern applied.

In step 370, it is determined if the current configuration passes the current test pattern. If in step 370, the current configuration passes the current test pattern, the method proceeds to step 360 where a check for the need for additional test patterns required is done. Else if in step 370, the current configuration fails the current test pattern, the method proceeds to step 375 where testing is terminated and the integrated circuit chip is marked as a fail on a post-fuse blow map or the module is marked as not good.

Thus, the embodiments of the present invention provide methods and integrated circuits that are cost-effective to repair.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the present invention may employ logic built-in self-test (LBIST) instead of an external tester. Therefore, it is intended that the following claims cover all such modifications and changes as fall within the true spirit and scope of the invention.

What is claimed is:

1. A method of generating a partial good integrated circuit, the method comprising:
    providing an integrated circuit having:
        a multiplicity of macro-circuits arranged in one or more groups, each macro-circuit of the same group being identical and having the same function;
        one or more repairable circuits;
        a fuse bank containing a multiplicity of fuses partitioned into a first set of fuses and a second set of fuses, states of fuses of said first set of fuses storing test data indicating at least which macro-circuits of said multiplicity of macro-circuits failed a first test, states of fuses of said second set of fuses storing test data indicating which repairable circuits of said one or more repairable circuits failed a second test
        a scan multiplexer and control circuit connected to scan-in I/O pads and scan-out I/O pads and connected to each of said macro-circuits, said scan multiplexer and control circuit including means for selectively connecting said scan-in I/O pads and scan-out I/O pads to and disconnecting said scan-in I/O pads and scan-out I/O pads from each of said macro-circuits of said multiplicity of macro-circuits during testing of said multiplicity of macro-circuits;
        means for isolating each macro-circuit of said multiplicity of macro-circuits from any other logic circuits of said integrated circuit chip and for means for connecting scan-in and scan-out pins dedicated to each macro-circuit of said multiplicity of macro-circuits to respective pads of said scan-in I/O pads and scan-out I/O pads; and
        means to replace failing circuit portions of said repairable circuits with redundant good circuit portions based on a state of fuses of said second set of fuses;
    isolating said macro-circuits from other circuits of said integrated circuit by connecting scan-in and scan-out pins dedicated to each macro-circuit of said multiplicity of macro-circuits to respective pads of said scan-in I/O pads and scan-out I/O pads;
    performing a first testing operation of each macro-circuit of said multiplicity of macro-circuits prior to a fuse programming operation;
    performing a second testing operation on each repairable circuit of said one or more repairable circuits prior to said fuse programming operation;
    programming fuses in said first set of fuses in order to store data indicating which macro-circuits failed said first testing operation;
    programming fuses in said second set of fuses in order to store data indicating which repairable circuits failed said second testing operation;
    for each macro-circuit of said multiplicity of macro-circuits that failed said first testing operation, permanently preventing utilization of the entire failing macro-circuit during operation of said integrated circuit based on data stored in said first set of fuses and configuring said integrated circuit to utilize only macro-circuits that passed said testing; and
    for each repairable circuit of said one or more repairable circuits replacing failing circuit portions of said repairable circuits with redundant good circuit portions based on data stored in said second set of fuses.

2. The method of claim 1, wherein:
    said integrated circuit further includes first scan chains coupling said other circuits, second scan chains coupled to said macro-circuits and isolation circuits coupled to third scan chains, said isolation circuits coupled between said other circuits and said macro-circuits; and
    further including the steps of coupling said first, second and third scan chains into a first configuration to achieve isolation of said other circuits from said macro-circuits and coupling said first, second and third scan chains into a second configuration to achieve isolation of said macro-circuits from each other and from said other circuits.

3. The method of claim 1, wherein said first testing operation includes applying sequentially one or more test patterns to each macro-circuit in each group macro-circuits and determining failing macro-circuits one group at a time.

4. The method of claim 1, further including keeping a count of failing macro-circuits during first testing operation and terminating testing when the number of failing macro-circuits exceeds a predetermined limit.

5. The method of claim 1, further including:
    writing data indicating at least which macro-circuits failed to a fuse blow file in a tester performing said first testing operation; and
    wherein said programming is performed based on data in said fuse blow file.

6. The method of claim 1, further including:
    performing a post fuse blow test, said post fuse blow test including in the order recited:
        masking each failing macro-circuit based on the data in said fuse bank;
        applying sequentially one or more test patterns to each macro-circuit in each group of macro-circuits and determining failing macro-circuits one group at a time; and
        terminating post fuse blow test upon any macro-circuit failing.

7. The method of claim 6, further including in the order recited:
    after performing said post fuse test, packaging said integrated circuit into a module; and
    performing a module test, said module test including in the order recited:
        masking each failing macro-circuit based on the data in said fuse bank;
        applying sequentially one or more test patterns to each macro-circuit in each group of macro-circuits and determining failing macro-circuits one group at a time; and
        terminating module test upon any macro-circuit failing.

8. The method of claim 1, wherein said macro-circuits are microprocessors.

9. The method of claim 1, wherein the step of preventing includes generating a busy signal for each macro-circuit that failed said test.

10. The method of claim 1, wherein the step of preventing includes disabling failing macro-circuits under the direction of an electronic system said integrated circuit is electrically connected to.

11. The method of claim 1, wherein said fuses are selected from the group consisting of laser blow fuses, electrical blow fuses or electrical blow antifuses.

* * * * *